(12) United States Patent
Philippens et al.

(10) Patent No.: US 8,785,916 B2
(45) Date of Patent: Jul. 22, 2014

(54) OPTOELECTRONIC ORGANIC COMPONENT AND METHOD FOR THE PRODUCTION THEREOF

(75) Inventors: Marc Philippens, Regensburg (DE); Ralph Paetzold, Roth (DE); Wiebke Sarfert, Herzogenaurach (DE); David Hartmann, Erlangen (DE); Arvid Hunze, Wainuiomata/Lower Hutt (NZ); Ralf Krause, Erlangen (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 123 days.

(21) Appl. No.: 13/499,608

(22) PCT Filed: Sep. 29, 2010

(86) PCT No.: PCT/EP2010/064494
§ 371 (c)(1),
(2), (4) Date: Jun. 12, 2012

(87) PCT Pub. No.: WO2011/039277
PCT Pub. Date: Apr. 7, 2011

(65) Prior Publication Data
US 2012/0241729 A1 Sep. 27, 2012

(30) Foreign Application Priority Data

Sep. 30, 2009 (DE) .......................... 10 2009 047 883

(51) Int. Cl.
*H01L 51/46* (2006.01)
*H01L 51/52* (2006.01)

(52) U.S. Cl.
CPC ........ *H01L 51/5206* (2013.01); *H01L 51/5221* (2013.01)
USPC .......... 257/40; 257/79; 257/E51.026; 438/22; 438/99

(58) Field of Classification Search
CPC .. H01L 51/52; H01L 51/5206; H01L 51/5221
USPC ................... 257/40, 79, E51.026; 438/22, 99
See application file for complete search history.

(56) References Cited

U.S. PATENT DOCUMENTS

| 7,233,105 B2 | 6/2007 | Itai et al. |
| 7,722,947 B2 | 5/2010 | Haas et al. |

(Continued)

FOREIGN PATENT DOCUMENTS

| CN | 1802878 | 7/2006 |
| CN | 1961437 | 5/2007 |

(Continued)

OTHER PUBLICATIONS

Heraeus, "CLEVIOS™ Hil 1.1" Conductive Polymers Division No. 81075892, Issue: Jan. 13, 2011.

(Continued)

*Primary Examiner* — Allan R Wilson
(74) *Attorney, Agent, or Firm* — Cozen O'Connor

(57) ABSTRACT

Optoelectronic organic component, comprising: a first electrode, a first planarization layer which is disposed on the first electrode, a first injection layer which is disposed on the planarization layer, an organic functional layer which is disposed on the injection layer, a second electrode which is disposed on the organic functional layer, wherein in the case that the first electrode is an anode, the following applies for the energy levels: $E_F - E_{HOMO,Inj.} \leq -E_{HOMO,Plan.}$ and $EF - E_{HOMO,Inj} < EHOMO,Funk.$ or in the case that the first electrode is a cathode, the following applies for the energy levels: $E_{LUMO,Inj.} - E_F \leq E_{LUMO,Plan.} - EF$ and $E_{LUMO,Inj.} - EF < E_{LUMO,Funk.} - E_F$, wherein $E_F$ is the fermi energy, $E_{HOMO}$ is the energy of the highest occupied energy level of the respective layer and $E_{LUMO}$ is the energy of the lowest unoccupied energy level of the respective layer.

16 Claims, 8 Drawing Sheets

7

(56) References Cited

U.S. PATENT DOCUMENTS

| | | | |
|---|---|---|---|
| 8,253,126 B2* | 8/2012 | Kang et al. | 257/40 |
| 2007/0126348 A1 | 6/2007 | Iou | |
| 2008/0118724 A1 | 5/2008 | Cina et al. | |
| 2011/0057176 A1* | 3/2011 | Kang et al. | 257/40 |
| 2013/0015424 A1* | 1/2013 | Chung et al. | 257/9 |

FOREIGN PATENT DOCUMENTS

| | | |
|---|---|---|
| CN | 101069299 | 11/2007 |
| CN | 101399319 | 4/2009 |
| EP | 1 643 812 | 4/2006 |
| EP | 1 756 886 | 2/2007 |
| EP | 2 045 847 | 4/2009 |
| JP | 2008-34788 | 11/2008 |
| TW | 200722498 | 6/2007 |
| WO | WO 2004-060028 | 7/2004 |
| WO | WO 2005/119807 | 12/2005 |
| WO | WO 2006/056586 | 6/2006 |

OTHER PUBLICATIONS

Heraeus, "CLEVIOS™ Hil 1.3" Conductive Polymers Division No. 81076058, Issue: Jan. 13, 2011.

Heraeus, "CLEVIOS™ Hil 1.5" Conductive Polymers Division No. 81076056, Issue: Jan. 13, 2011.

Heraeus, "CLEVIOS™ P Jet (OLED)" Conductive Polymers Division No. 81075906, Issue: Dec. 22, 2010.

Heraeus, "CLEVIOS™ P Jet UA" Conductive Polymers Division No. 81076077, Issue: Dec. 22, 2010.

Heraeus, "CLEVIOS™ P VP AI 4083" Conductive Polymers Division No. 81075812, Issue: Dec. 22, 2010.

Heraeus, "CLEVIOS™ P VP CH 8000" Conductive Polymers Division No. 81076795, Issue: Dec. 21, 2010.

English Translation of Office Action dated Mar. 5, 2014 issued in the corresponding Chinese Patent Application No. 201080044040.6.

English Translation of an Office Action dated May 7, 2014 issued in the corresponding Japanese Patent Application No. 2012-531418.

\* cited by examiner

OPTOELECTRONIC ORGANIC COMPONENT AND METHOD FOR THE PRODUCTION THEREOF

RELATED APPLICATIONS

This is a U.S. national stage of application No. PCT/EP2010/064494, filed on Sep. 29, 2010. Priority is claimed on the following application: German Application No.: 10 2009 047 883.3 filed on Sep. 30, 2009, the disclosure content of which is hereby incorporated by reference.

FIELD OF THE INVENTION

The present invention is related to an optoelectronic organic component.

BACKGROUND OF THE INVENTION

A very widespread problem in the production of optoelectronic organic components is that small particles or other impurities can be accumulate on the surface of the electrodes which face towards the interior of the component, or the surface can comprise e.g. metal barbs. This can be e.g. the cause of possible local short-circuits or local, high-ohmic current paths in the component. One previously used way of eliminating this problem is to subject the surface to a very troublesome cleaning process. Another approach is to apply a thick layer over the electrode which covers e.g. the metal barbs. However, layers such as these cause the problem that statistical scattering occurs in the current-voltage characteristics. A reason for this is found in the fluctuations in local layer thickness which are caused e.g. by the impurities. This can also result in fluctuations in resistance which have a detrimental effect upon process stability.

SUMMARY OF THE INVENTION

An object of embodiments of the invention is to provide an optoelectronic organic component, in which the statistical scattering in the current-voltage characteristics is reduced in the case where there is a large number of these components.

One embodiment of the invention relates to an optoelectronic organic component, comprising:
 a first electrode,
 a first planarization layer which is disposed on the first electrode,
 a first injection layer which is disposed on the planarization layer,
 an organic functional layer which is disposed on the injection layer,
 a second electrode which is disposed on the organic functional layer,
 wherein in the case that the first electrode is an anode, the following applies for the energy levels:

$$E_F - E_{HOMO,Inj.} \leq E_F - E_{HOMO,Plan.} \text{ and}$$
$$E_F - E_{HOMO,Inj.} < E_F - E_{HOMO,Funk.} \text{ or}$$

in the case that the first electrode is a cathode, the following applies for the energy levels:

$$E_{LUMO,Inj.} - E_F \leq E_{LUMO,Plan.} - E_F \text{ and } E_{LUMO,Inj.} - E_F < E_{LUMO,Funk.} - E_F,$$

wherein $E_F$ is the fermi energy, $E_{HOMO}$ is the energy of the highest occupied energy level of the respective layer and $E_{LUMO}$ is the energy of the lowest unoccupied energy level of the respective layer.

Wherein preferably in the case that the first electrode is an anode, the following applies for the energy levels:

$$E_F - E_{HOMO,Inj.} < E_F - E_{HOMO,Plan.} \text{ and}$$
$$E_F - E_{HOMO,Inj.} < E_{HOMO,Funk.} \text{ or}$$

in the case that the first electrode is a cathode, the following applies for the energy levels:

$$E_{LUMO,Inj.} - E_F < E_{LUMO,Plan.} - E_F \text{ and } E_{LUMO,Inj.} - E_F < E_{LUMO,Funk.} - E_F.$$

By specifically combining the first planarization layer and the first injection layer, the statistical scattering in the current-voltage characteristics can be lowered considerably. By specifically adjusting the energy levels of the first planarization layer, the first injection layer and the organic functional layer, an internal reservoir is formed. The charge carriers which are emitted by the first electrode during operation of the optoelectronic organic component travel through the first planarization layer into the first injection layer. By reason of the energy levels, a potential well, in which the charge carriers can accumulate, forms in the first injection layer. By reason of this internal reservoir which is formed by the potential well of the injection layer and is located inside the optoelectronic organic component, i.e., between the two electrodes of the component, local fluctuations in the resistance of the electrodes or of the planarization layer can thus be equalised. Charge carrier transport inside the component can thus be stabilised and any possibly occurring field and resistance fluctuations can be equalised. The potential well represents to a certain extent a dedicated source of charge carriers which, during operation of the component, is able to emit charge carriers in a constant quantity to a defined surface to the subsequent organic functional layer. Therefore, in spite of possible impurities or metal barbs on the inner sides of the electrodes, stable charge transport can be achieved in the component.

In a further embodiment of the invention, the following applies for the energy levels in the case that the first electrode is an anode:

$$E_F - E_{HOMO,Plan.} < E_F - E_{HOMO,Funk.} \text{ or}$$

the following applies for the energy levels in the case that the first electrode is a cathode:

$$E_{LUMO,Funk.} - E_F < E_{LUMO,Plan.} - E_F.$$

By correspondingly adjusting the energy levels, it is possible to determine the height of the "sidewalls" of the potential well. This height of the sidewalls indicates in energy terms the resistance a charge carrier must overcome in order to pass into the next adjoining layer. If this resistance is selected to be sufficiently high, this ensures that enough charge carriers will accumulate in the potential well, as a result of which charge carriers in the injection layer will be available at any time for injection into the subsequent layer. Charge carriers can thus be emitted in a uniform and constant manner with respect to time and/or space. The "capacity" of charge carriers of the potential well can thus also be set by the height of the sidewalls.

In a further embodiment of the invention, the charge carriers emitted by the first electrode are accumulated in the first injection layer. This means that during operation of the optoelectronic organic component the charge carrier density is higher in the injection layer than in the layers directly adjacent thereto.

In a further embodiment of the invention, the charge carriers accumulated in the first injection layer are injected into the subsequent layer.

The injection of the accumulated charge carriers into the subsequent layer ensures that the subsequent layer is supplied continuously and constantly with the charge carrier, thus stabilising charge transport in the component.

In a further embodiment of the invention, the following condition applies for the resistances R of the first planarization layer ($R_{Plan.}$) and the first injection layer ($R_{Inj.}$), and for the boundary surface resistance through contact between the first planarization layer and the first injection layer ($R_{Kontakt,Inj.}$) and the boundary surface resistance through contact between the first injection layer and the organic functional layer ($R_{Kontakt,Funk.}$):

$$R_{Plan.} + R_{Kontakt,Inj.} \leq R_{Inj.} + R_{Kontakt,Funk.}.$$

In this case, the resistance of the planarization layer is preferably in the range of the resistance of the injection layer.

In a further embodiment of the invention, the first injection layer has a layer thickness of 1 to 20 nm.

In this case, the range of 1 to 3 nm is preferred. Even a very thin injection layer can contribute to stabilising charge carrier transport significantly. This has the advantage that it is not necessary to apply a very thick layer once more to the already thicker planarization layer, which would result in a considerable increase in the size of the component in terms of its total thickness.

A further preferred range is 3 to 20 nm. A layer of this thickness has particularly good stabilisation properties in relation to charge carrier transport.

In a further embodiment of the invention, the first injection layer is doped. In the case that the first electrode is an anode, the first injection layer is preferably p-doped. In the case that the first electrode is a cathode, the injection layer is preferably n-doped.

Doping the injection layer renders it possible to set e.g. the energy level thereof in a specific manner. Furthermore, doping can also serve to improve charge carrier transport or charge carrier accumulation in the injection layer.

In a further embodiment of the invention, the dopant is selected from: $MoO_2$, $MoO_3$, $WO_3$, $ReO_3$, $Re_2O_7$, $V_2O_5$. These dopants are preferably used as p-dopants.

In a further embodiment of the invention, the first injection layer comprises a matrix material selected from: $Alq_3$ (LUMO −3.1 eV), BCP (LUMO −2.9 eV), Bphen (LUMO −2.9 eV), NTCDA (LUMO −4.0 eV), ZnPc, THAP (LUMO −4.6 eV). In this case, the matrix material is n-doped with one of the following substances: Li, Cs, BEDT-TTF, pyronin-B-chloride, $Cs_2CO_3$, $Ru(terpy)_2$, $CoCp_2$. In this case, "LUMO" is the lowest unoccupied molecular orbital.

In a further embodiment of the invention, the first injection layer comprises a substance selected from: 4,4',4''-tris(N-(1-naphthyl)-N-phenyl-amino)triphenylamine, phthalocyanine-copper complex, 4,4',4''-tris(N-3-methylphenyl N-phenyl-amino)triphenylamine, N,N'-bis(naphthalene-1-yl)-N,N'-bis(phenyl)-benzidine, 2,2',7,7'-tetrakis(N,N-diphenylamine)-9,9'-spirobifluorene, di-[4-(N,N-ditolyl-amino)-phenyl]cyclohexane, N,N'-bis(3-methylphenyl)-N,N'-bis(phenyl)-benzidine.

The following table lists the energy levels of the respectively highest occupied molecular orbitals (HOMOs) of the respective substances.

| | |
|---|---|
| 4,4',4''-tris(N-(1-naphthyl)-N-phenyl-amino)triphenylamine | −5.0 eV |
| phthalocyanine-copper complex | −5.2 eV |
| 4,4',4''-tris(N-3-methylphenyl-N-phenyl-amino)triphenylamine | −5.0 eV |
| N,N'-bis(naphthalene-1-yl)-N,N'-bis(phenyl)-benzidine | −5.5 eV |
| 2,2',7,7'-tetrakis(N,N-diphenylamino)-9,9'-spirobifluorene | −5.4 eV |
| di-[4-(N,N-ditolyl-amino)-phenyl]cyclohexane | −5.5 eV |
| N,N'-bis(3-methylphenyl)-N,N'-bis(phenyl)-benzidine | −5.57 eV |

The position of the HOMOs can be determined e.g. by means of cyclic voltammetry.

In a further embodiment of the invention, the first injection layer comprises a substance selected from: PEDOT:PSS, poly(9-vinylcarbazole), poly(N,N'-bis(4-butylphenyl)-N,N'-bis(phenyl)-benzidine, poly(3-hexylthiophene), polyaniline.

The following table indicates the HOMO ranges for three of these substances:

| | |
|---|---|
| PEDOT:PSS | −5.0 to −5.9 eV |
| poly(N,N'-bis(4-butylphenyl)-N,N'-bis(phenyl)-benzidine | −5.1 to −5.17 eV |
| poly(3-hexylthiophene) | −5.23 eV |

The exact energy level value of the individual layers can be set by the respective doping thereof. Therefore, for the first injection layer and the first planarization layer it is possible to use the same matrix material whose exact energy levels can be set e.g. by means of a dopant.

In a further embodiment of the invention, the first planarization layer comprises a substance selected from: PEDOT:PSS, PEDOT-based materials, poly(9-vinylcarbazole), poly(N,N'-bis(4-butylphenyl)-N,N'-bis(phenyl)-benzidine, poly(3-hexylthiophene), Polyaniline.

In a further embodiment of the invention, the first planarization layer comprises an inorganic planarization layer. This can comprise a substance selected from: InO, GaO, ZnO, SnO, MoO, VO, SbO, BiO, ReO, TaO, WO, NbO, NiO.

By knowing the energy levels of the first injection layer or first planarization layer, it is possible to adapt these to each other by means of doping and/or material selection and material mixing such that the energy levels are provided in the previously described ratio with respect to each other. The same applies to adapting the energy levels of the first injection layer and the organic functional layer.

The listed substances can also be applied effectively as a planarization layer to the electrode or as an injection layer to planarization layer.

In a further embodiment of the invention, the first planarization layer is disposed directly on the first electrode. The first planarization layer has a thickness which is greater than the height of irregularities on the first electrode. As a consequence, it is possible to compensate for the irregularities on the first electrode by means of the first planarization layer.

In a further embodiment of the invention, the optoelectronic organic component additionally comprises:
  a second planarization layer which is disposed between the second electrode and the organic functional layer,
  a second injection layer which is disposed between the second planarization layer and the organic functional layer.

In this embodiment, the two electrodes each comprise a planarization layer and in each case an injection layer is disposed between the two planarization layers and the organic functional layer. As a consequence, the emission of electrons from the cathode and also the emission of holes from the anode to the organic functional layer are each stabilised by an injection layer. Such an embodiment thus has a particularly stable charge carrier transport.

In one embodiment of the invention, the optoelectronic organic component is formed as an electroluminescent component.

It can be e.g. an organic light-emitting diode (OLED). The layer stack which can form an OLED comprises an anode and a cathode. From which, through the application of a voltage, holes or electrodes, respectively, are released, which migrate toward the direction of the respective other electrode. In this case, the charge carriers initially migrate e.g. through hole-transporting or electron-transporting layers before they recombine each other in a light-emitting layer. In this light-emitting layer the electrons together with the holes form excitons. The excitons can excite luminescent substances, which are located in the emitting layer, for the emission of radiation. The OLED can comprise an organic functional layer which can be e.g. a light-emitting, charge carrier-blocking or charge carrier-transporting layer or a combination thereof.

At least one further embodiment of the invention relates to a method for the production of an optoelectronic organic component.

In one embodiment for the production of an optoelectronic organic component, the method comprises the steps of:
A) providing a first electrode,
B) applying a first planarization layer to the first electrode,
C) applying a first injection layer to the first planarization layer,
D) applying an organic functional layer to the first injection layer,
E) applying a second electrode to the organic functional layer, wherein in the case that the first electrode is an anode the following applies for the energy levels:

$$E_F - E_{HOMO,Inj.} \leq E_F - E_{HOMO,Plan.} \text{ and}$$
$$E_F - E_{HOMO,Inj.} < E_F - E_{HOMO,Funk.} \text{ or}$$

in the case that the first electrode is a cathode, the following applies for the energy levels:

$$E_{LUMO,Inj.} - E_F \leq E_{LUMO,Plan.} - E_F \text{ and } E_{LUMO,Inj.} - E_F < E_{LUMO,Funk.} - E_F m$$

wherein $E_F$ is the fermi energy, $E_{HOMO}$ is the energy of the highest occupied energy level of the respective layer and $E_{LUMO}$ is the energy of the lowest unoccupied energy level of the respective layer.

Furthermore, the method can comprise features and steps, by means of which an optoelectronic organic component having one or several of the aforementioned features can be produced.

The first planarization layer can be applied in method step B) onto the first electrode by means of vapour deposition or by means of a wet-chemical process. The first planarization layer serves to cover any impurities such as e.g. dust, glass, metal or organic particles which can still remain on the electrode despite the fact that it has been cleaned. Furthermore, the first planarization layer is applied in such a thickness that it surrounds and covers metal barbs of the electrode which can be produced e.g. by reason of a sputtering technique for production of the first electrode. As a consequence, any field superelevations of the electrical field, which forms during operation of the optoelectronic organic component, between the electrodes are weakened and the electrical inclusion of these impurities is thus reduced. By applying the first injection layer in method step C) and the organic functional layer in method step D) at the suitable energy levels, the potential well is formed in the form described above. Both the first injection layer and the organic functional layer can be applied by means of vapour deposition and with the aid of a wet-chemical process.

In a further variant of the method, the first injection layer is applied in method step C) by means of a wet-chemical process.

In a further variant of the method, the first planarization layer is applied in method step B) by means of a wet-chemical method.

In a further variant of the method, the organic functional layer is applied in method step D) by means of a wet-chemical process.

The use of wet-chemical processes makes it possible to reduce the process costs. The layers can be applied e.g. by spin-coating, doctor blade-coating or printing methods. For this purpose, e.g. solution-based organic materials can be used.

Alternatively, the first injection layer, the first planarization layer and the organic functional layer can be deposited, in each case independently of each other, from the vapour phase.

In a further variant of the method, it additionally comprises the method steps of:
F) applying a second injection layer to the organic functional layer,
G) applying a second planarization layer to the second injection layer.

Steps F) and G) are then performed prior to step E).

A component which has been produced in accordance with a method with additional steps F) and G) thus comprises a planarization layer and an injection layer on both electrodes in each case facing the organic functional layer.

In a further variant of the method, the second injection layer is applied in method step F) by means of a wet-chemical method.

In a further variant of the method, the second planarization layer is applied in method step G) by means of a wet-chemical method.

Alternatively, the second injection layer and the second planarization layer, can also be deposited, in each independently of each other, from the vapour phase.

DETAILED DESCRIPTION OF THE DRAWINGS

Figure 1A:
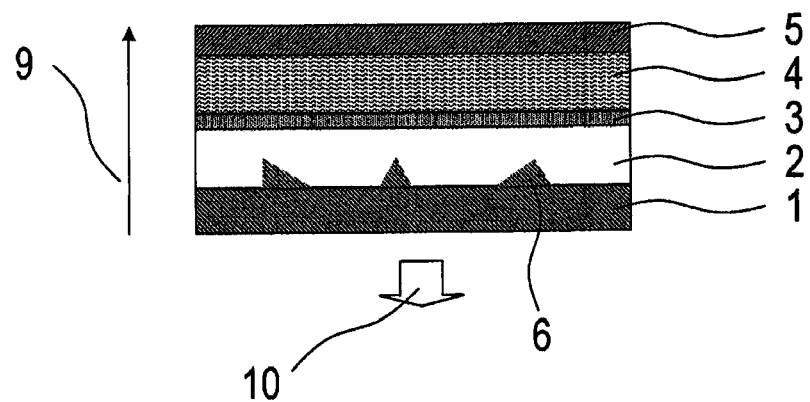
FIGS. 1a to d each show a schematic cross-section of embodiments of the invention.
Figure 1B:
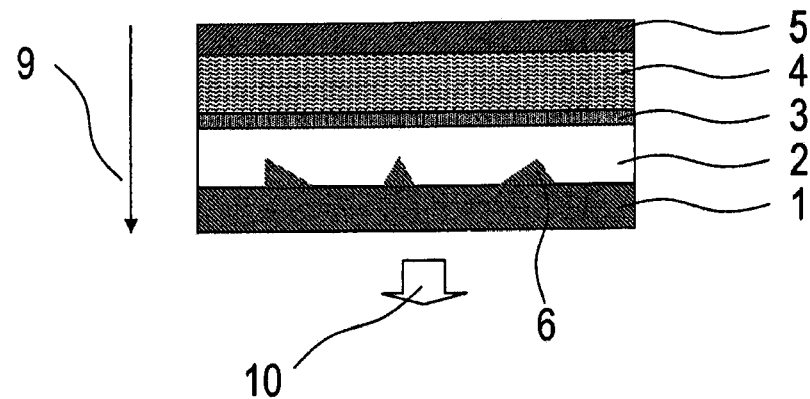
Figure 1C:
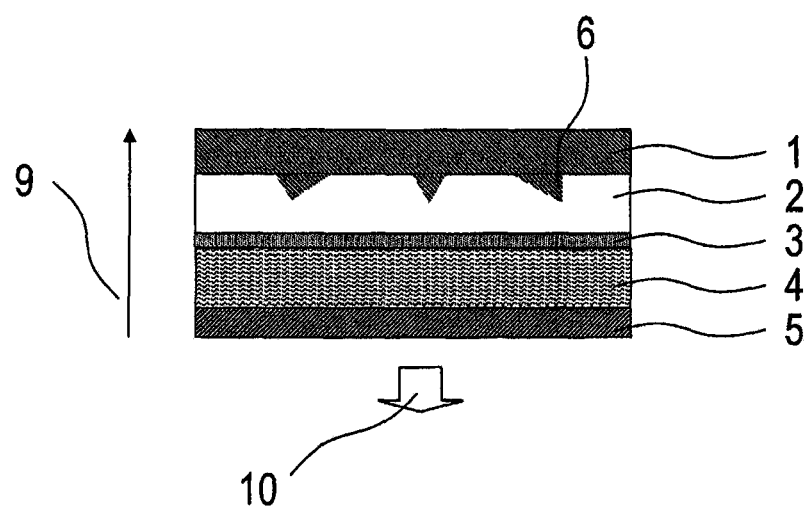
Figure 1D:
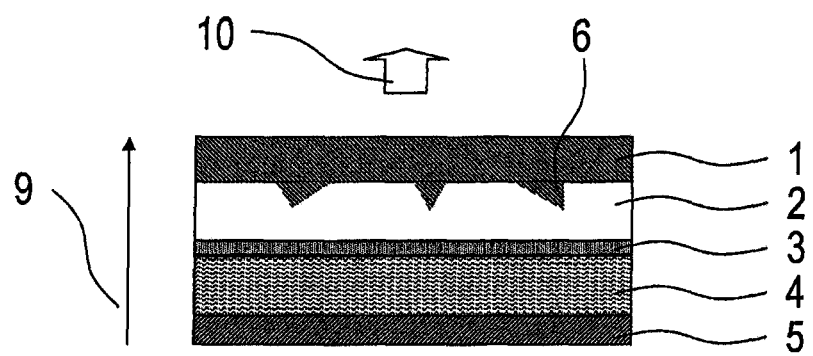
Figure 2A:
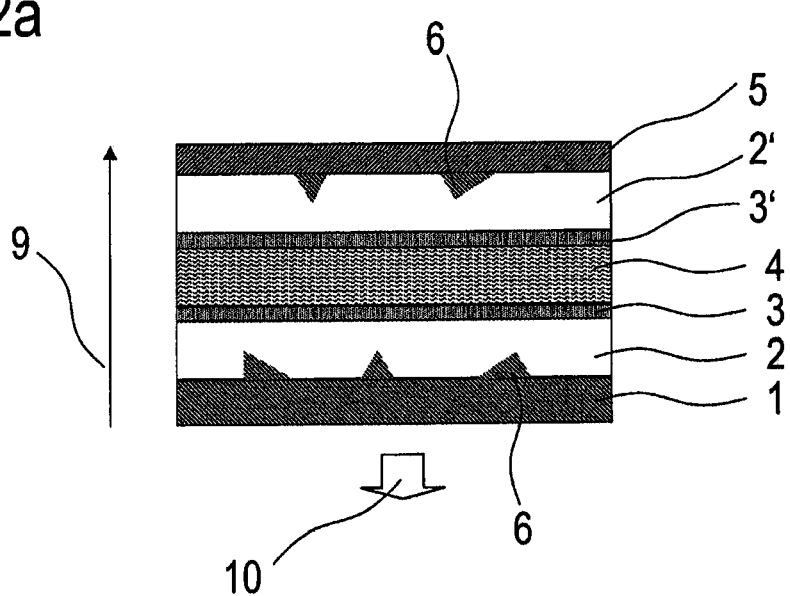
FIGS. 2a to d each show a schematic cross-section of embodiments of the invention which comprise a second planarization layer and a second injection layer.
Figure 2B:
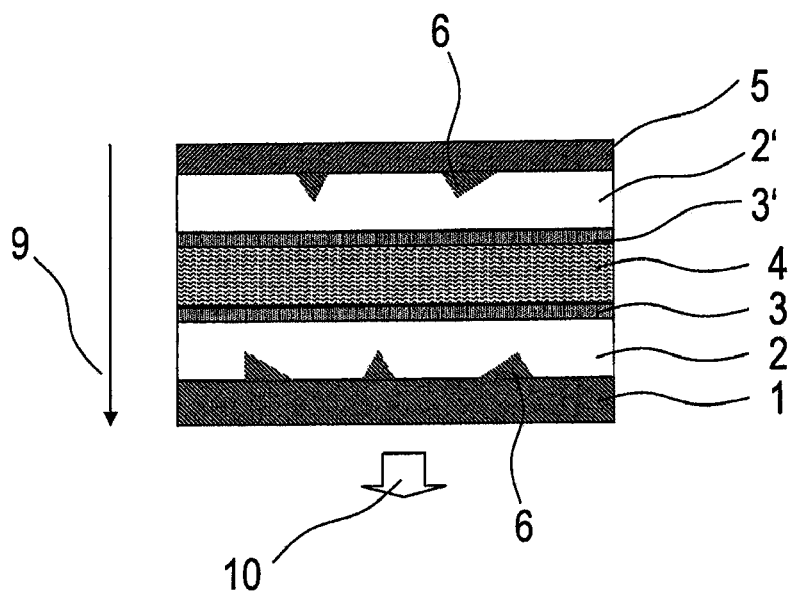
Figure 2C:
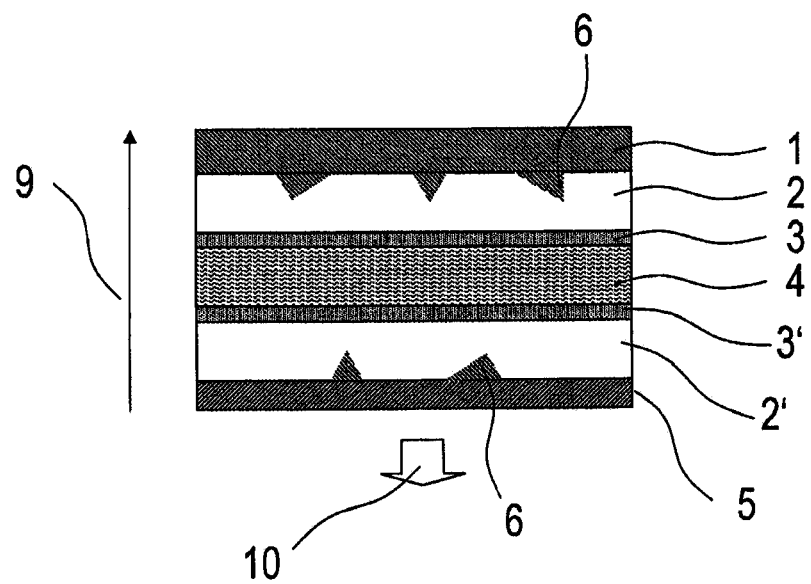
Figure 2D:
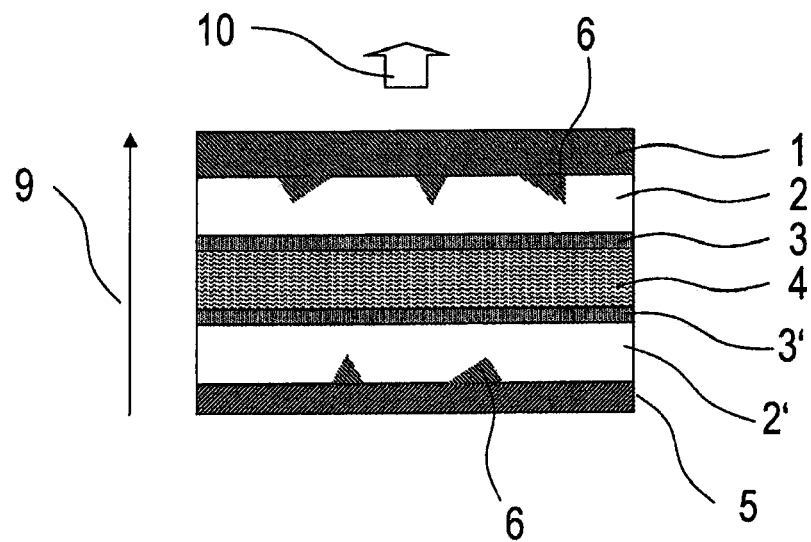

FIGS. 1a to d each show a schematic cross-section of an exemplified embodiment in accordance with the invention. The arrow 9 in each case on the left next to the layer stack indicates the sequence in which the layers are applied one on top of the other. It can be performed e.g. in accordance with one of the above-described methods in method steps A) to E). The block arrow 10 below or above the components indicates the direction of the light emission of the respective component. Each of the four exemplified embodiments includes a layer sequence comprising a first electrode 1 which has on its surface irregularities 6 which can be formed by impurities or surface structures of the electrode surface. These irregularities are covered and thus compensated for by a first planarization layer 2 which is disposed thereon. The first planarization layer 2 is followed in each case by a first injection layer 3 which is thinner compared thereto. Together with the subsequent organic functional layer 4, a potential well is formed in the first injection layer 3 by the suitable selection of materials, in the manner described in the general part. The layer sequence also comprises a second electrode 5.

FIGS. 2a to d each show a schematic cross-section of embodiments of the invention which, in contrast to the embodiments as illustrated in FIGS. 1a to d, additionally comprise a second planarization layer 2' and a second injection layer 3'. These can be formed e.g. by the aforementioned method steps F) and G). In this case, the second planarization layer 2' is disposed in each case between the second electrode 5 and the second injection layer 3'. The second injection layer 3' is disposed in each case between the second planarization layer 2' and the organic functional layer 4.

The organic functional layer 4 can be e.g. a light-emitting, charge carrier-blocking or charge carrier-transporting layer or a combination thereof.

The first and/or second electrode 1, 5 can be, in each case independently of each other, a sputtered electrode, a thermally vapour-deposited electrode or an electrode processed from solution.

Figure 3A:
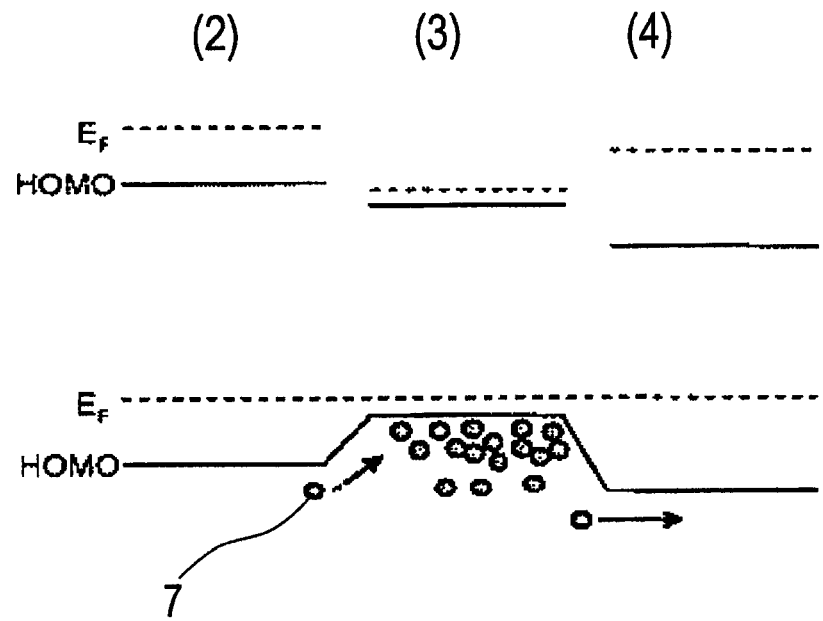
FIGS. 3a and b each show energy diagrams of the layers involved in optoelectronic organic components of embodiments of the invention.
Figure 3B:
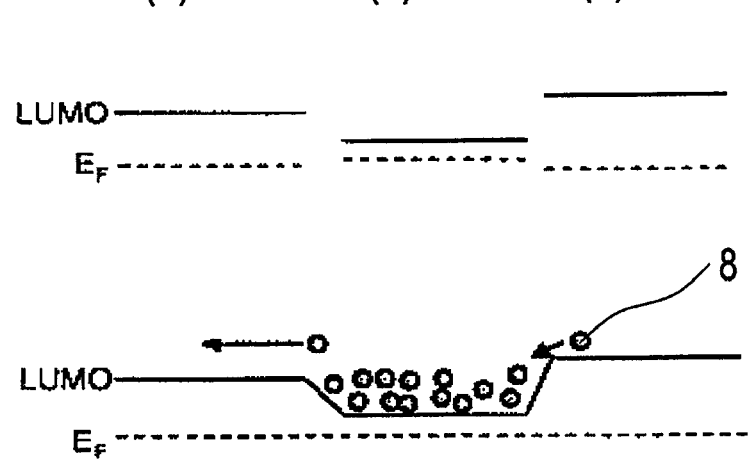

FIGS. 3a and 3b each show the energy diagrams of the first planarization layer 2 of the subsequent first injection layer 3 and of the organic functional layer 4. The upper half shows in each case the energy diagram prior to contact-formation, and the lower half shows in each case the energy diagram after contact-formation of the individual layers. After contact-formation, a potential well is formed in the thermodynamic equilibrium. In the respective Figures, $E_F$ designates the fermi energy.

FIG. 3a show the respective energy levels of the highest occupied molecular orbitals (HOMOs). From the left-hand side the holes 7 are emitted by the electrode, in this case the anode, into the first planarization layer 2. The contact formation of the individual layers has caused the formation of a potential well, in which the holes 7 can then be accumulated, in the first injection layer 3. From this potential well, they can then be released into the subsequent organic functional layer. This ensures that the adjoining organic functional layer 4 is supplied uniformly and permanently with holes 7, which contributes to the stabilisation of the charge transport in the component.

FIG. 3b shows the energy levels of the lowest unoccupied molecular orbitals (LUMOs). In this case, electrons 8 are injected from the right-hand side into the first planarization layer 2 by the electrode, in this case the cathode. By suitable selection of the materials, a potential well is also formed in this case in the injection layer 3, whereby the electrons 8 accumulate therein. The electrons 8 can then be emitted from the potential well into the organic functional layer 4.

Figure 4:
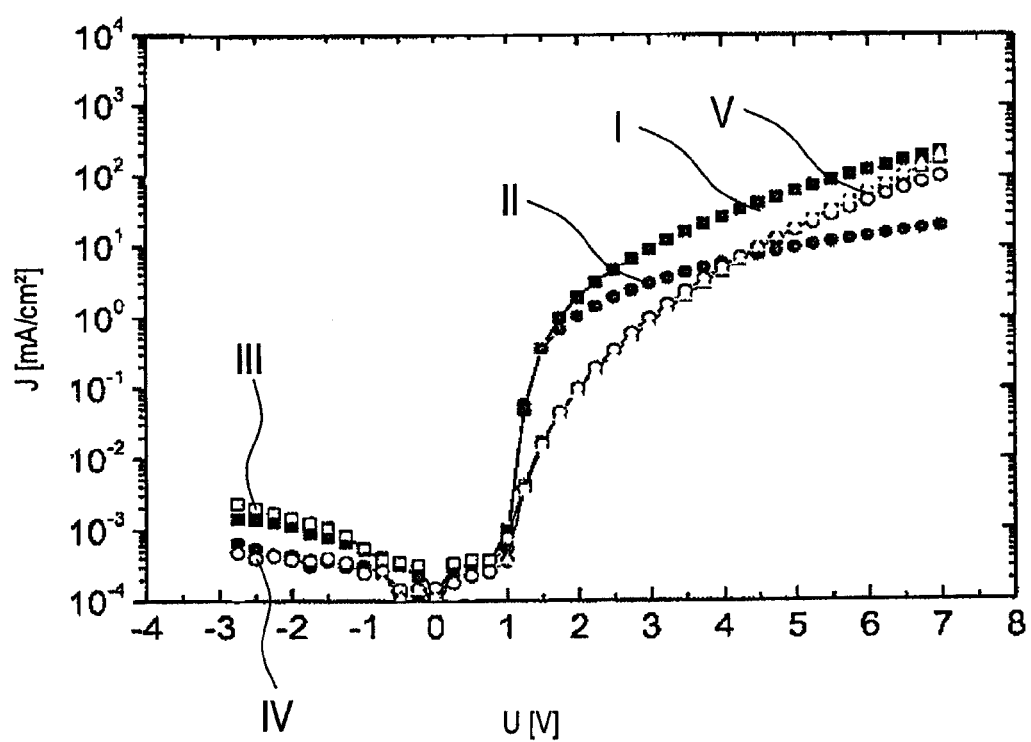
FIG. 4 shows five current-voltage characteristic curves of organic components.

FIG. 4 shows five current-voltage characteristic curves (designated by Roman numerals I to V) for five different components. In each case, current density J is plotted with respect to the applied voltage U. The components are components having predominantly holes as charge carriers (so-called "Hole-only-structural parts"). They have the following structure: an ITO-anode, a first planarization layer in a thickness of 120 nm which at the same time serves as a hole-injecting layer (HIL), optionally a p-doped injection layer in a thickness of 20 nm, an organic functional layer of N,N'-di(naphtha-1-yl)-N,N'-diphenyl-benzidine (NPB) in a thickness of 100 nm and an Al-cathode. The components, for which the characteristic curves I and II are recorded, do not comprise a first injection layer in each case, they are components which are not inventive. In contrast, the components, for which the characteristic curves III and IV are recorded, are [inventive] components and comprise an injection layer. For the components of the characteristic curves I and III, the same polymers have been selected in each case for the first planarization layer and the first injection layer. The same applies to the components, for which the characteristic curves II or IV have been recorded. Therefore, the components for which the characteristic curves I and III and II and IV respectively have been recorded, differ in each case merely by reason of the presence or absence of the first injection layer. The component, for which the characteristic curve V has been recorded, does not comprise a first planarization layer nor a first injection layer. As shown in the illustration, the characteristic curves of the components which comprise only a planarization layer but no injection layer are fairly different, whereas the characteristic curves for the components having a planarization layer and an injection layer extend almost congruently in the range of 1 to 7 volt.

FIGS. 5a and 5b and 6a and 6b show the current-voltage characteristic curves for 32 identically constructed components one on top of the other. In this case, current density J is plotted with respect to voltage U. Each Figure indicates the scatter present at a specific measuring point for the 32 components. The measured components each have an active area of 4 mm$^2$. The components are white-emitting OLEDs in each case.

Figure 5A:
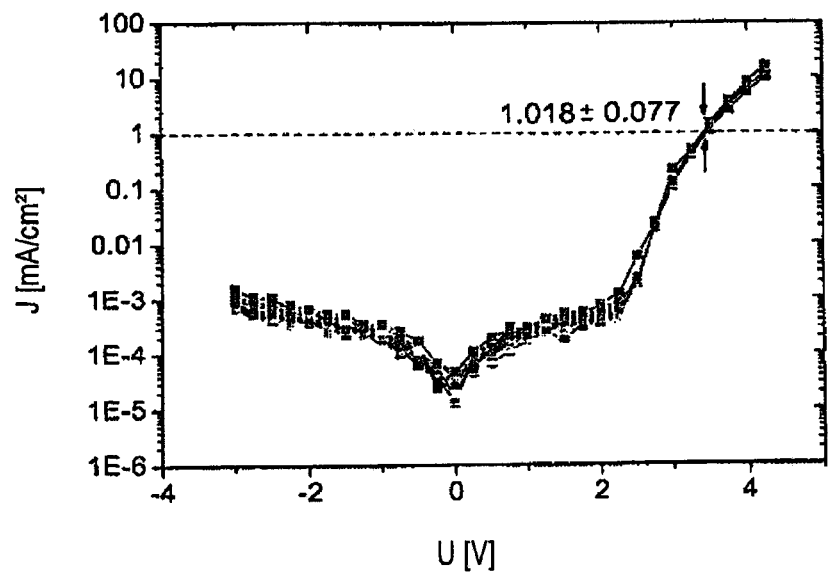
FIGS. 5a and b show in a comparison the characteristic curve of an inventive component in accordance with one embodiment compared to a non-inventive component having a first polymer.
Figure 6A:
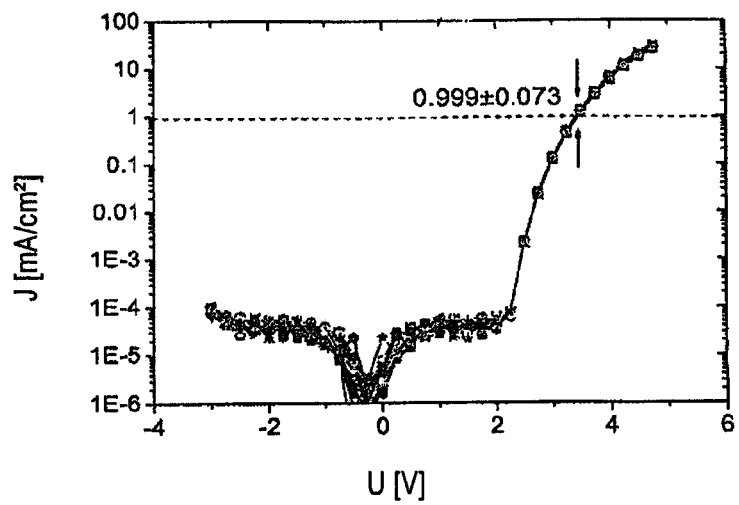
FIGS. 6a and b show in a comparison the characteristic curve of an inventive component in accordance with one embodiment compared to a non-inventive component having a second polymer.

The components illustrated in FIGS. 5a and 6a are in each a component in accordance with the invention. In each case, they comprise the following structure: an ITO-anode, a first planarization layer in a thickness of 100 nm, a first injection layer in a thickness of 20 nm, an organic functional layer in a thickness of 90 nm and an Al-cathode. The two components which have been measured in FIG. 5a and FIG. 6a respectively differ merely in terms of the polymer which has been used for the planarization layer and the injection layer.

Figure 5B:
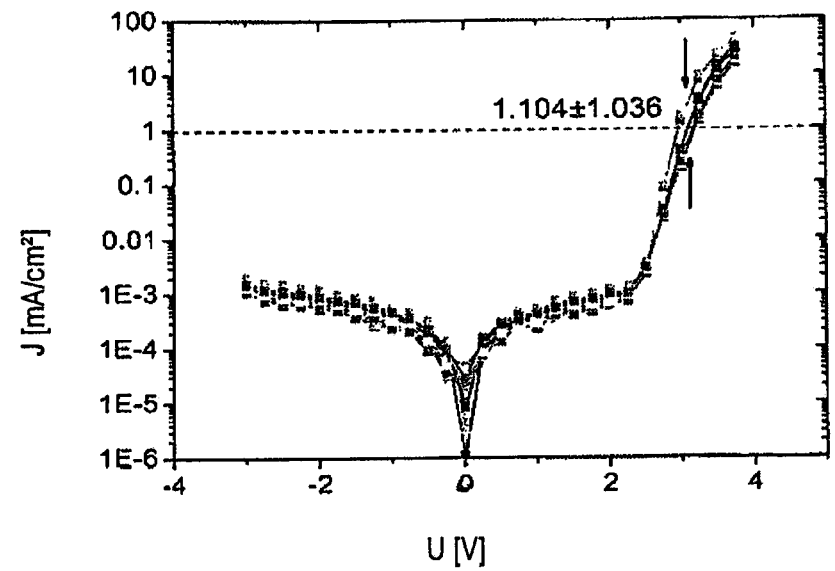
Figure 6B:
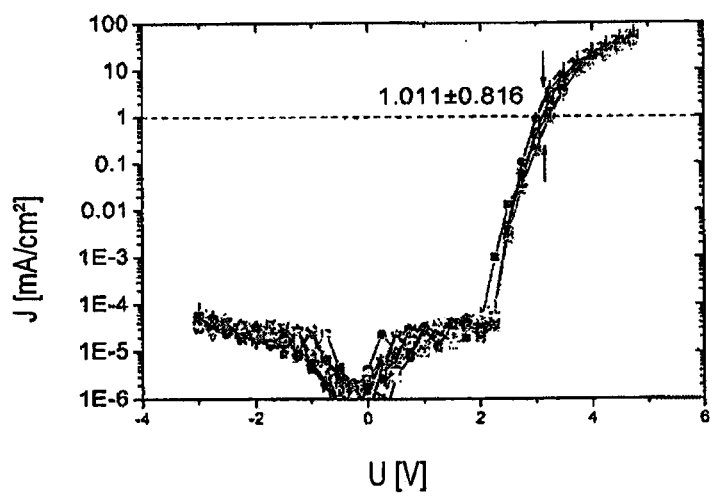

In contrast, in FIGS. 5b and 6b components which are not inventive have been measured. Their structure was changed with respect to the inventive components illustrated in 5a and 6a respectively such that instead of the combination of a first planarization layer and first injection layer only a planarization layer has been used which has a thickness of 120 nm. The thickness of this planarization layer thus corresponds to the sum of the layer thicknesses in the inventive components consisting of a first planarization layer and a first injection layer. For the components measured in FIGS. 5a and 5b, the same polymer was used in each case for the planarization layer. The same also applies to the components of FIGS. 6a and 6b.

As is clearly apparent from the diagrams, at a current density of about 1 mA/cm$^2$ the two exemplified embodiments in accordance with the invention have clearly less scatter than the non-inventive components which are illustrated in each case in FIGS. 5b and 6b and which do not have the first injection layer. It is thus clearly apparent that by means of a specific combination of the first planarization layer and the first injection layer the statistical scattering can be reduced considerably in the current-voltage characteristic curve progression. Therefore, in the range of the typical operating voltage between 3V and 4V the components in accordance with the invention have a considerably improved process stability compared with the non-inventive components without an injection layer.

The invention is not limited by the description using the exemplified embodiments. On the contrary, the invention includes any new feature and any combination of features included in particular in any combination of features in the Claims, even if this feature or this combination itself is not explicitly stated in the claims or exemplified embodiments.

The invention claimed is:

1. An optoelectronic organic component, comprising:
   a first electrode,
   a first planarization layer which is disposed on the first electrode,
   a first injection layer which is disposed on the planarization layer,
   an organic functional layer which is disposed on the injection layer,
   a second electrode which is disposed on the organic functional layer,
   wherein in the case that the first electrode is an anode, the following applies for the energy levels:

$$E_F - E_{HOMO,Inj.} \leq E_F - E_{HOMO,Plan.} \text{ and}$$
   $$E_F - E_{HOMO,Inj.} < E_F - E_{HOMO,Funk.}, \text{ or}$$

in the case that the first electrode is a cathode, the following applies for the energy levels:

$$E_{LUMO,Inj.} - E_F \leq E_{LUMO,Plan.} - E_F \text{ and } E_{LUMO,Inj.} - E_F < E_{LUMO,Funk.} - E_F,$$

wherein $E_F$ is the fermi energy, $E_{HOMO}$ is the energy of the highest occupied energy level of the respective layer and $E_{LUMO}$ is the energy of the lowest unoccupied energy level of the respective layer.

2. The optoelectronic organic component as claimed in claim 1, wherein in the case that the first electrode is an anode, the following applies for the energy levels:

$$E_F - E_{HOMO,Plan.} < E_F - E_{HOMO,Funk.}, \text{ or}$$

in the case that the first electrode is a cathode, the following applies for the energy levels:

$$E_{LUMO,Funk.} - E_F < E_{LUMO,Plan.} - E_F.$$

3. The optoelectronic organic component as claimed in claim 1,
   wherein the charge carriers emitted by the first electrode are accumulated in the first injection layer.

4. The optoelectronic organic component as claimed in claim 3, wherein the charge carriers which are accumulated in the first injection layer are injected into the subsequent layer.

5. The optoelectronic organic component as claimed in claim 1,
   the following condition applies for the resistances R of the first planarization layer ($R_{Plan.}$) and the first injection layer ($R_{Inj.}$), and for the boundary surface resistance through contact between the first planarization layer and the first injection layer ($R_{Kontakt,Inj.}$) and the boundary surface resistance through contact between the first injection layer and the organic functional layer ($R_{Kontakt,Funk.}$):

$$R_{Plan.} + R_{Kontakt,Inj.} \leq R_{Inj.} + R_{Kontakt,Funk.}.$$

6. The optoelectronic organic component as claimed in claim 1, wherein the first injection layer has a layer thickness of 1 to 20 nm.

7. The optoelectronic organic component as claimed in claim 1, wherein the first injection layer is doped.

8. The optoelectronic organic component as claimed in claim 7, wherein the dopant is selected from: $MoO_2$, $MoO_3$, $WO_3$, $ReO_3$, $Re_2O_7$, $V_2O_5$.

9. The optoelectronic organic component as claimed in claim 1, wherein the first injection layer comprises a substance selected from:
   4,4',4''-tris(N-(1-naphthyl)-N-phenyl-amino)triphenylamine, phthalocyanine-copper complex, 4,4',4''-tris(N-3-methylphenyl-N-phenyl-amino)triphenylamine, N,N'-bis (naphthalene-1-yl)-N,N'-bis(phenyl)-benzidine, 2,2',7,7'-tetrakis(N,N-diphenylamine)-9,9'-spirobifluorene, di-[4-(N,N-ditolyl-amino)-phenyl]cyclohexane, N,N'-bis(3-methylphenyl)-N,N'-bis(phenyl)-benzidine.

10. The optoelectronic organic component as claimed in claim 1,
    wherein the first injection layer comprises a substance selected from:
    PEDOT:PSS, poly(9-vinylcarbazole), poly(N,N'-bis(4 butylphenyl)-N,N'-bis(phenyl)-benzidine, poly(3-hexylthiophene), polyaniline.

11. The optoelectronic organic component as claimed in claim 1,
    wherein the first planarization layer (2) comprises a substance selected from:
    PEDOT:PSS, PEDOT-based materials, poly(9-vinylcarbazole), poly(N,N'-bis(4-butylphenyl)-N,N'-bis(phenyl)-benzidine, poly(3-hexylthiophene), polyaniline.

12. The optoelectronic organic component as claimed in claim 1, additionally comprising:
    a second planarization layer which is disposed between the second electrode and the organic functional layer,
    a second injection layer which is disposed between the second planarization layer and the organic functional layer.

13. The optoelectronic organic component as claimed in claim 1, which is formed as an electroluminescent component.

14. A method for the production of an optoelectronic organic component, comprising the method steps of:
    A) providing a first electrode,
    B) applying a first planarization layer to the first electrode,
    C) applying a first injection layer to the first planarization layer,
    D) applying an organic functional layer to the first injection layer,
    E) applying a second electrode to the organic functional layer,
    wherein in the case that the first electrode is an anode the following applies for the energy levels:

$$E_F - E_{HOMO,Inj.} \leq E_F - E_{HOMO,Plan.} \text{ and}$$
    $$E_F - E_{HOMO,Inj.} < E_F - E_{HOMO,Funk.}, \text{ or}$$

in the case that the first electrode is a cathode, the following applies for the energy levels:

$$E_{LUMO,Inj.} - E_F \leq E_{LUMO,Plan.} - E_F \text{ and } E_{LUMO,Inj.} - E_F < E_{LUMO,Funk.} - E_F,$$

wherein $E_F$ is the fermi energy, $E_{HOMO}$ is the energy of the highest occupied energy level of the respective layer and $E_{LUMO}$ is the energy of the lowest unoccupied energy level of the respective layer.

15. The method as claimed in claim 14, wherein the first injection layer is applied in method step C) by means of a wet-chemical process.

16. An optoelectronic organic component, comprising:

a first electrode;

a first planarization layer which is disposed on the first electrode;

a first injection layer which is disposed on the first planarization layer;

an organic functional layer which is disposed on the first injection layer;

a second electrode which is disposed on the organic functional layer;

a second planarization layer which is disposed between the second electrode and the organic functional layer, a second injection layer which is disposed between the second planarization layer and the organic functional layer, wherein the first electrode is an anode with the following energy levels:

$$E_F - E_{HOMO,Inj.} \leq E_F - E_{HOMO,Plan.} \text{ and}$$
$$E_F - E_{HOMO,Inj.} < E_F - E_{HOMO,Funk.} \text{ and}$$

the second electrode is a cathode with the following energy levels:

$$E_{LUMO,Inj.} - E_F \leq E_{LUMO,Plan.} - E_F \text{ and } E_{LUMO,Inj.} - E_F < E_{LUMO,Funk.} - E_F,$$

wherein $E_F$ is the fermi energy, $E_{HOMO}$ is the energy of the highest occupied energy level of the respective layer and $E_{LUMO}$ is the energy of the lowest unoccupied energy level of the respective layer.

* * * * *